(12) United States Patent
Lee et al.

(10) Patent No.: US 10,883,003 B2
(45) Date of Patent: Jan. 5, 2021

(54) METHODS FOR PRODUCING POLYMER GELS, AND USES THEREOF

(71) Applicant: THE TRUSTEES OF THE STEVENS INSTITUTE OF TECHNOLOGY, Hoboken, NJ (US)

(72) Inventors: Stephanie Lee, Hoboken, NJ (US); Jing He, Union City, NJ (US); Dilhan M. Kalyon, Teaneck, NJ (US)

(73) Assignee: THE TRUSTEES OF THE STEVENS INSTITUTE OF TECHNOLOGY, Hoboken, NJ (US)

( * ) Notice: Subject to any disclaimer, the term of this patent is extended or adjusted under 35 U.S.C. 154(b) by 0 days.

(21) Appl. No.: 16/562,064

(22) Filed: Sep. 5, 2019

(65) Prior Publication Data

US 2020/0071546 A1   Mar. 5, 2020

Related U.S. Application Data

(60) Provisional application No. 62/727,518, filed on Sep. 5, 2018.

(51) Int. Cl.
*B05D 1/26* (2006.01)
*C09D 5/24* (2006.01)
*C09D 165/00* (2006.01)
*H01L 51/42* (2006.01)
*H01L 51/00* (2006.01)
*C09D 7/20* (2018.01)

(52) U.S. Cl.
CPC ............... *C09D 5/24* (2013.01); *C09D 7/20* (2018.01); *C09D 165/00* (2013.01); *H01L 51/0007* (2013.01); *H01L 51/4253* (2013.01)

(58) Field of Classification Search
None
See application file for complete search history.

(56) References Cited

U.S. PATENT DOCUMENTS

2013/0255757 A1* 10/2013 Jiang .................. H01L 31/0481
                                                              136/251

* cited by examiner

*Primary Examiner* — Alexander M Weddle
(74) *Attorney, Agent, or Firm* — Lewis Roca Rothgerber Christie LLP; Ralph W. Selitto, Jr.; John K. Kim (57) ABSTRACT

Embodiments of the invention include methods for producing polymer gels useful in the fabrication of organic cells. The method includes mixing poly(3-hexylthiophene) with phenyl-C61 butyric acid methyl ester and solvent to form a first solution, where the poly(3-hexylthiophene) includes at least some regioregular poly(3-hexylthiophene). The first solution is then cooled to a specified temperature to induce gelation to form an at least partially gelled solution that can be deposited onto a surface to form a coated surface. At least one or more steps of the method can occur as an extrusion process carried out in a twin-screw or single-screw extruder.

20 Claims, 6 Drawing Sheets

METHODS FOR PRODUCING POLYMER GELS, AND USES THEREOF

RELATED APPLICATIONS

This application claims priority to U.S. provisional application Ser. No. 62/727,518, filed on Sep. 5, 2018, the entire contents of which are incorporated herein by reference.

STATEMENT REGARDING FEDERALLY SPONSORED RESEARCH OR DEVELOPMENT

This invention was made with government support under Grant Number 1635284 awarded by the National Science Foundation. The government has certain rights in the invention.

FIELD OF THE INVENTION

The invention pertains to the formation of interconnected network structures in polymer gels created from a semiconducting polymer solution using a novel gelation pathway. The polymer gels can be used in the production of organic solar cells, or to produce polymer nanocomposites with hierarchical porosity in applications such as membrane filtration and food products.

BACKGROUND

Organic solar cells are potentially a multi-trillion-dollar product opportunity that could be used world-wide for conversion of solar energy into electricity. Their flexibility would allow them to be installed on curved surfaces, including those of vehicles and buildings, as well as windows due to their semi-transparent nature. These lightweight, portable devices can also be used for electricity generation in off-grid field operations.

For bulk-heterojunction organic solar cell applications, regioregular poly(3-hexylthiophene) (also described herein as "RR-P3HT") is usually co-dissolved in solution with phenyl-C61-butyric acid methyl ester (hereinafter also referred to as "PCBM"), which is then spun-cast onto device platforms to form a photoactive layer. Creating organic solar cells in this manner has been expensive due, among other things, to the high-cost of spin coating. Furthermore, lower efficiencies have oftentimes been seen in comparison to inorganic solar cells.

Viscoelastic phase separation, a phenomenon unique to polymer and colloidal systems displaying dynamic asymmetry between components, is a powerful thermodynamic process to form interconnected network structures. The formation of a gel of organic polymers at relatively low temperatures followed by doctor blading could be one pathway for continuous processing of organic solutions for solar cell fabrication with lower cost, as well as possibly higher efficiency than that of conventional methods. Such processes could potentially increase the efficiency of organic solar cells as well as lower the cost of manufacturing. Additionally, doctor blading could enable the deposition of gel-like structures with controlled micro and nanostructures that cannot be achieved with other methods. Moreover, the process of using continuous methods for dissolution of the polymers that form the active layers (i.e., mixing, cooling of the solution, the pumping and coating followed by passing the coated active layers through an oven under controlled temperature and humidity conditions), could lower the cost of processing while making it easier to control the quality of the organic cells.

SUMMARY

Some embodiments include a method comprising a step of at least partially mixing poly(3-hexylthiophene) with phenyl-C61 butyric acid methyl ester and at least one solvent to form a first solution which comprises said poly(3-hexylthiophene), said phenyl-C61 butyric acid methyl ester, and said at least one solvent, where said poly(3-hexylthiophene) includes at least some regioregular poly(3-hexylthiophene). A second step of said method includes cooling said first solution to a specified temperature to induce gelation of at least a portion of said first solution to form an at least partially gelled solution. A third step of said method includes depositing at least a portion of said at least partially gelled solution onto at least a portion of a surface to form an at least partially coated surface. Finally, a fourth step of said method includes at least partially drying said at least partially coated surface by removing at least a portion of said at least one solvent from at least a portion of said at least partially coated surface.

In some embodiments of said method, said specified temperature is between $-5°$ C. and $-15°$ C. In some embodiments of said method, at least one of step i) and step ii) is performed in an extruder. In some embodiments of said method, said extruder is a twin-screw extruder. In some embodiments of said method, step iii) is performed using one or more of a slit-die, a doctor-blade, or a blade-coater.

In some embodiments of said method, said surface of said at least a portion of a surface comprises an outer surface of a solar cell precursor material. In some embodiments of said method, said solar cell precursor material comprises indium tin oxide. In some embodiments of said method, said at least one solvent includes ortho-dichlorobenzene.

Some embodiments of said method further comprise a step of annealing said at least partially coated surface by passing said at least partially coated surface through an oven. In some embodiments of said method, said oven is an environmentally-controlled oven configured to control temperature and humidity. In some embodiments of said method, at least two or more of said steps i) to at least step iii) occur simultaneously.

In some embodiments of said method, said at least partially gelled solution includes a semi-crystalline gel network. In some embodiments of said method, said at least partially gelled solution is a thermo-reversible gel. In some embodiments of said method, said poly(3-hexylthiophene) includes at least some regiorandom poly(3-hexylthiophene).

Some embodiments include an extrusion process comprising the steps of (i) providing an extruder including at least one mixing zone, and (ii) feeding poly(3-hexylthiophene), phenyl-C61 butyric acid methyl ester, and at least one solvent into said at least one mixing zone of said extruder, wherein said poly(3-hexylthiophene) includes at least some regioregular poly(3-hexylthiophene). In some embodiments, a third step includes operating said extruder to form a first solution which comprises said poly(3-hexylthiophene), said phenyl-C61 butyric acid methyl ester, and said at least one solvent. Further, a fourth step can include cooling said first solution to a specified temperature to induce gelation of at least a portion of said first solution to form an at least partially gelled solution. Further, a fifth step can include depositing at least a portion of said at least partially gelled solution onto at least a portion of a surface to form an at least partially coated surface. Further, a sixth step can include at least partially drying said at least partially coated surface by removing at least a portion of said at least one solvent from at least a portion of said at least partially coated surface.

In some embodiments of said extrusion process, said fourth step occurs in said extruder. In some further embodiments, said fifth step occurs by operating said extruder to force at least a portion of said solution out of said extruder and through a die. In some embodiments, said die includes one or more of a slit-die, a doctor-blade, or a blade-coater. In some embodiments, said extruder comprises a twin-screw extruder. In some embodiments of said extrusion process, said poly(3-hexylthiophene) includes at least some regio-random poly(3-hexylthiophene).

DESCRIPTION OF THE DRAWINGS

For a more complete understanding of the present disclosure, reference is made to the following detailed description of an exemplary embodiment considered in conjunction with the accompanying drawings, in which.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives that fall within the scope of embodiments of the invention.

Some embodiments of the invention include methods for improvement of the manufacture of organic solar cells. In an embodiment, regioregular poly(3-hexylthiophene) is initially mixed with phenyl-C61 butyric acid methyl ester and one or more solvents, typically ortho-dichlorobenzene (hereinafter also referred to as "o-DCB"), using continuous processing means, such as a twin-screw extruder, to generate a solution of regioregular poly(3-hexylthiophene) and PCBM. The solution is then rapidly cooled to form a gel, and the cooled gelatinous solution is pumped through a doctor blade in order to coat a substrate, typically indium tin oxide. The coating process can be done using the same continuous processing means employed in the mixing, dissolving and cooling steps referenced hereinabove. Subsequently, the solvent can be removed and the structure can be annealed by passing the coated substrate through an environmentally-controlled oven (i.e., an oven controlled for temperature and humidity).

To summarize the foregoing discussion, the method described above can include steps of mixing of regioregular poly(3-hexylthiophene), PCBM and one or more solvents using continuous processing means (e.g., using a twin-screw extruder) to generate a solution of regioregular poly(3-hexylthiophene), and PCBM (typically using o-DCB as the solvent). In a further step, the solution can be cooled to −5°

C. to form a gel either as a gel dispersed in the solution, or where the solution has gelled. In a subsequent step, the gelled solution can be pumped through a doctor blade to coat a substrate, such as indium tin oxide. The same twin-screw extruder that is used to mix, dissolve and cool the solution can be used to pump the solution onto a moving substrate for coating. Removal of the solvent and annealing of the structure can be accomplished by passing the coated substrate through an environmentally-controlled oven (temperature and humidity control).

Figure 1:
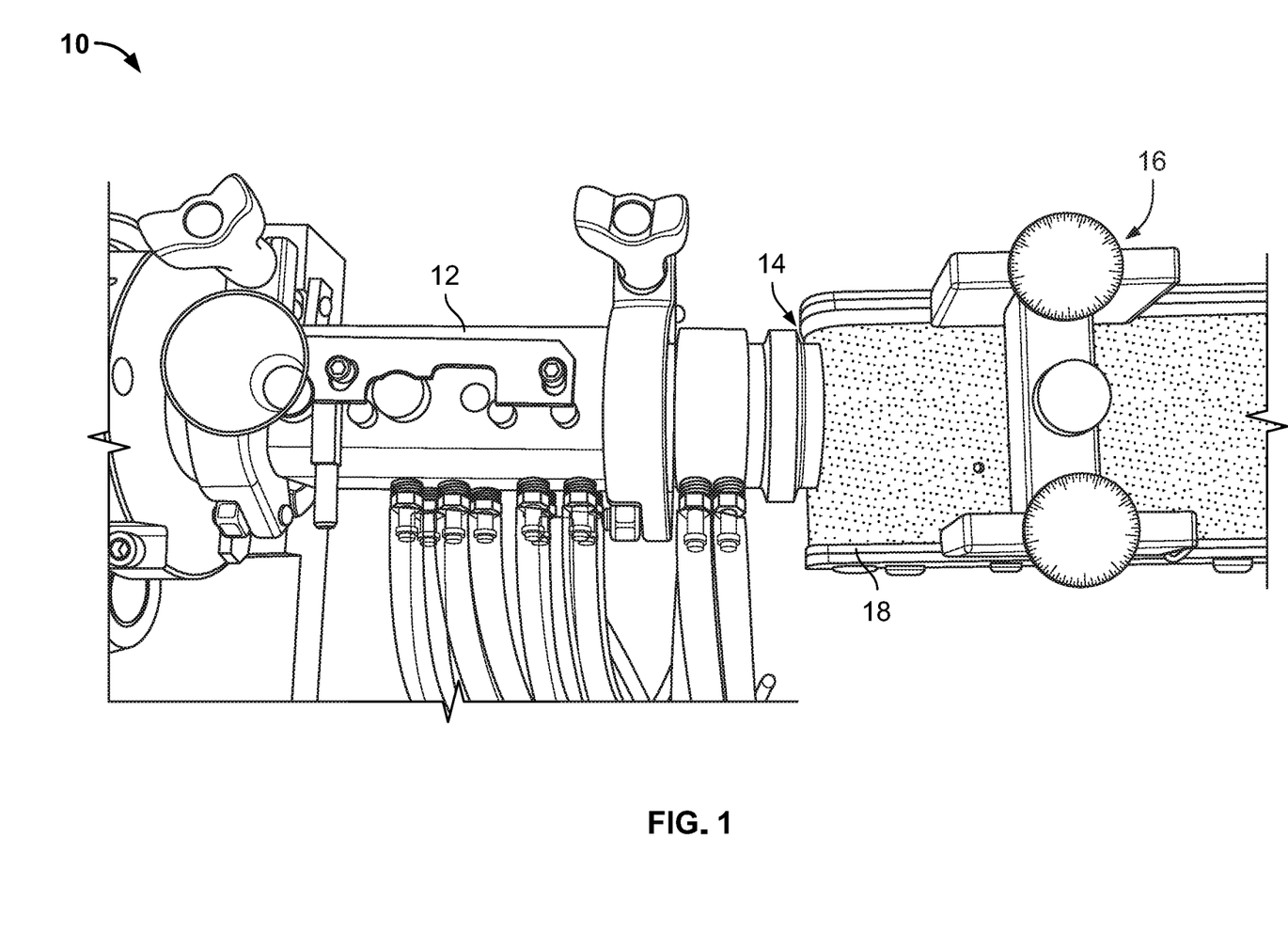
FIG. 1 depicts one embodiment of an apparatus including an extruder adapted for the manufacture of organic solar cells.

FIG. 1 depicts an apparatus 10 including an extruder 12 for manufacturing organic solar cells using the methods described herein. In some embodiments, the extruder 12 is a twin-screw extruder that can be used in one or more of the mixing, cooling, gelation, and extrusion of the gel to form a gel-coated surface. For example, in some embodiments, after mixing, cooling, and gelation processes in the extruder 12, the gel can be passed through a slit die 14 and coated onto a substrate (e.g., indium tin oxide) via a blade coater or doctor blade 16 and a motorized substrate conveyer 18. In other embodiments, the extruder 12 can be a single-screw extruder.

Figure 2:
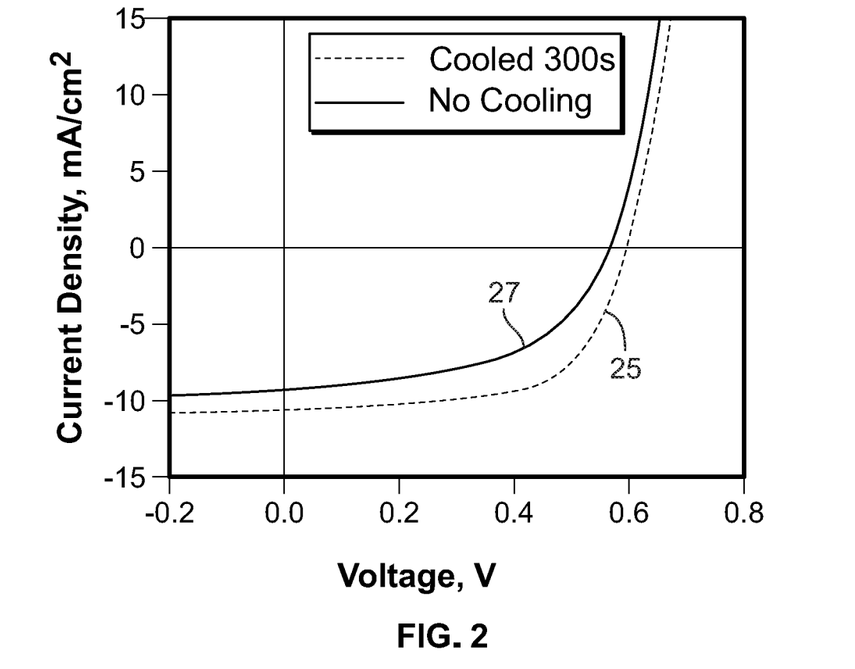
FIG. 2 shows a J-V curve of best performing solar devices manufactured according to an embodiment of the present invention, depicting results achieved with no cooling step and with a cooling step.
Figure 3:
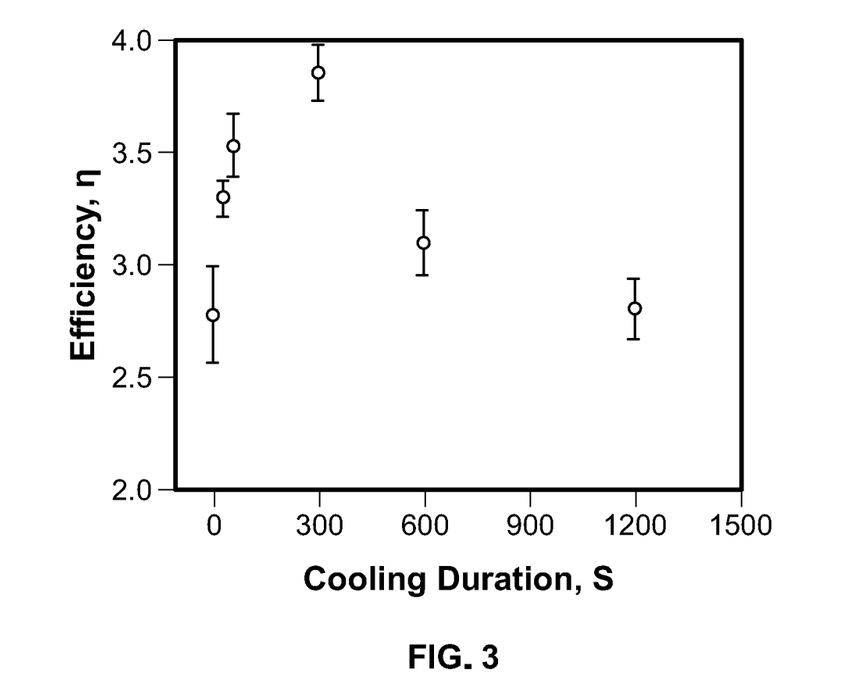
FIG. 3 shows the efficiency of solar cells manufactured according to an embodiment of the present invention plotted against the cooling duration of the RR-P3HT/PCBM solution conducted before the blade coating step.

Organic solar cells using the product created by the process of the present invention as their active layer exhibited up to 45% higher efficiency compared to active layers deposited from uncooled solutions. The increased efficiency of the solar cell under the processing conditions of the present invention, including dissolution, cooling and doctor blading, is displayed in FIG. 2, showing J-V curves for solar cell devices with an active layer blade-coated from a cooled solution of RR-P3HT/PCBM (shown as the data curve 25), and solar cell devices with an active layer blade-coated from an uncooled solution of RR-P3HT/PCBM (shown as the data curve 27). By controlling the duration of cooling prior to doctor blading, the structure can be altered to provide an enhanced efficiency of the solar device. For example, FIG. 3 shows the efficiency of solar cells manufactured according to an embodiment of the present invention plotted against the cooling duration of the RR-P3HT/PCBM solution conducted before the blade coating step, showing a maximum efficiency around 300 seconds of cooling.

Figure 4:
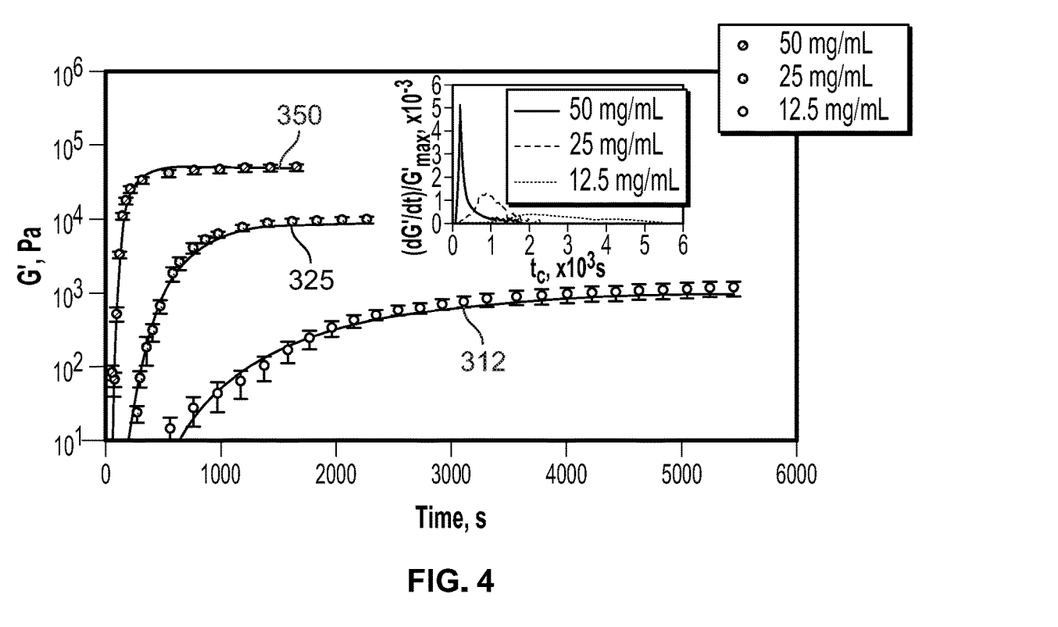
FIG. 4 shows a plot of storage modulus, G', versus time of RR-P3HT solutions in ortho-dichlorobenzene with concentrations 12.5, 25, 50 mg/mL cooled from room temperature to −5° C., where the inset displays the steady-state storage modulus, G'max, and characteristic time of gelation, $t_c$, versus concentration in accordance with some embodiments of the invention.

To monitor the cooling-induced gelation of RR-P3HT solutions in o-DCB, a series of oscillatory shear tests as a function of P3HT concentration, frequency, and temperature were performed. FIG. 4 shows a plot of storage modulus, G', versus time of RR-P3HT solutions in o-DCB cooled from room temperature to $-5°$ C., where the inset displays the steady-state storage modulus, $G'_{max}$, and characteristic time of gelation, $t_c$, versus concentration in accordance with some embodiments of the invention. The experiments were carried out at RR-P3HT concentrations of 12.5 mg/ml (shown as data line 312), 25 mg/ml (shown as data line 325), and 50 mg/ml (shown as data line 350), and the linear viscoelastic moduli were collected as a function of time at $-5°$ C. under small-amplitude oscillatory shear (SAOS) conditions, with a strain amplitude and frequency of 1% and 1 rad/s, respectively. As displayed in the FIG. 4, all three solutions initially exhibited a large increase in G', followed by a monotonic increase to a plateau, i.e., reaching a concentration-dependent steady-state value of G', denoted as Gmax'. The value of Gmax' was found to increase from 1 to 50 kPa as the RR-P3HT concentration in o-DCB was increased from 12.5 to 50 mg/ml. The loss moduli, G", values (not shown in FIG. 4) that were collected as a function of time for all three concentrations of the solutions were negligible in comparison to the values of G', i.e., the G" values were only in the 10-1000 Pa range, thus, were at least 10 times smaller than the corresponding storage moduli, G'.

Figure 5:
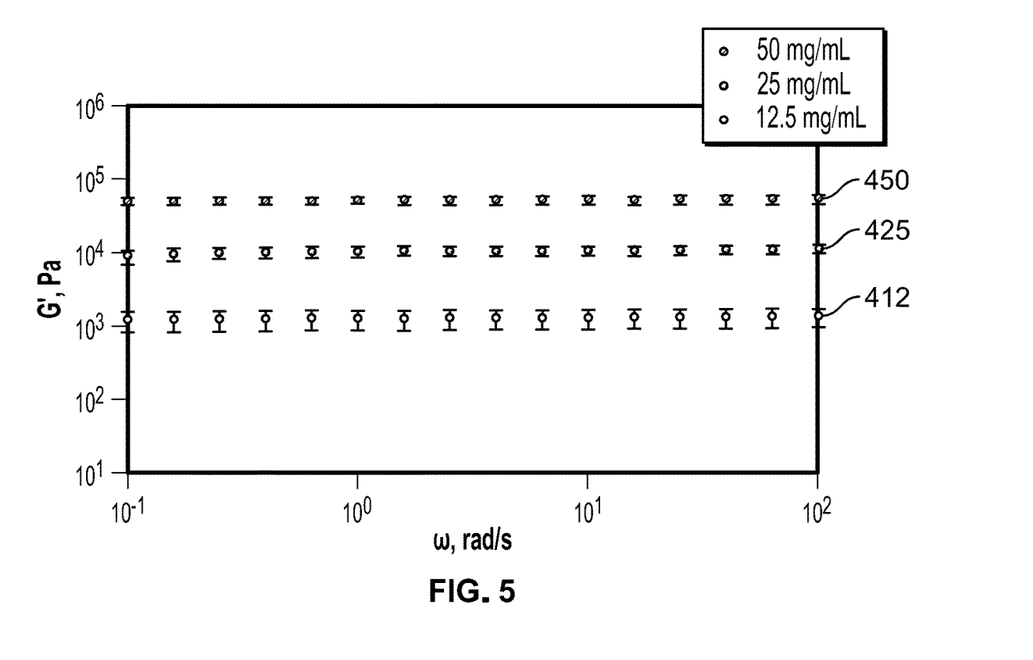
FIG. 5 shows a plot of storage modulus, G', versus frequency at a strain amplitude of 1% (linear viscoelastic region) of cooled RR-P3HT solutions after reaching steady state at −5° C. in accordance with some embodiments of the invention.

After stable gel formation, the cooled RR-P3HT solutions were subjected to frequency sweeps in the linear viscoelastic region. FIG. 5 shows a plot of storage modulus, G', versus frequency at a strain amplitude of 1% (linear viscoelastic region) of cooled RR-P3HT solutions after reaching steady state at $-5°$ C. in accordance with some embodiments of the invention. The experiments were carried out at RR-P3HT concentrations of 12.5 mg/ml (shown as data line 412), 25 mg/ml (shown as data line 425), and 50 mg/ml (shown as data line 450). For all concentrations of RR-P3HT, G' values were constant at their respective Gmax' values over a frequency range of 0.1 to 100 rad/s. The observations that G' and G" are independent of frequency and that the value of tan $\delta = G''/G'$ is smaller than 0.1 in this range, i.e., $G'(\omega) \gg G''(\omega)$, are both hallmarks of gel-like behavior.

Figure 6:
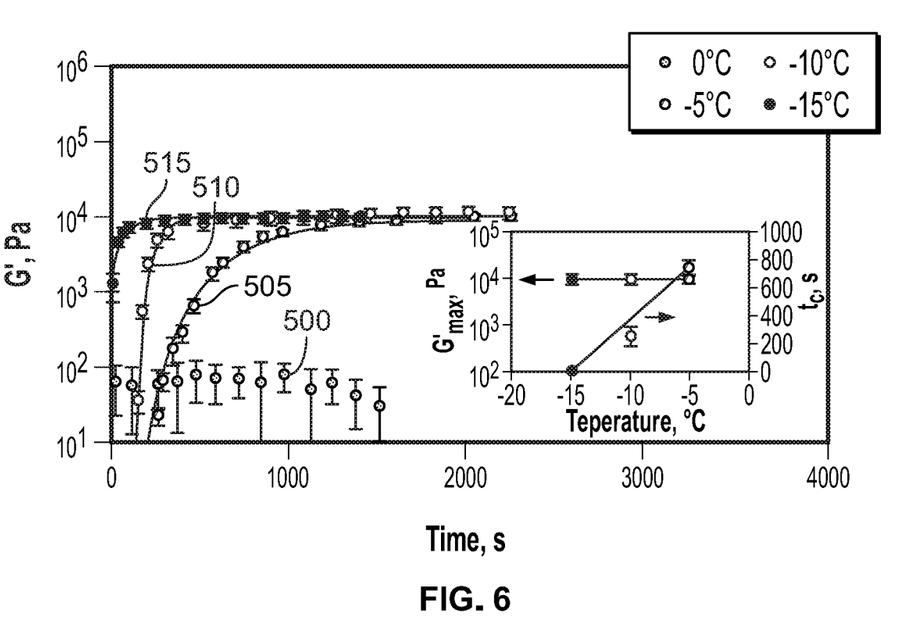
FIG. 6 shows a plot of storage modulus, G', versus time of 25 mg/mL RR-P3HT solutions cooled to 0, −5, −10, and −15° C., where the inset displays $G'_{max}$ and $t_c$ versus temperature in accordance with some embodiments of the invention.

Referring again to FIG. 4, and with additional reference to FIG. 6, showing a plot of storage modulus, G', versus time in seconds of 25 mg/mL RR-P3HT solutions cooled to $0°$ C. (data line 500), $-5°$ C. (shown as data line 505), $-10°$ C. (shown as data line 510), and $-15°$ C. (shown as data line 515), where the inset displays G'max and characteristic time of gelation ($t_c$) versus temperature, the Gmax' can be defined as the "gel strength" which depends on the concentration of the RR-P3HT and temperature. The observed $G'(\omega) \gg G''(\omega)$ (tan $\delta = G''/G'$ is smaller than 0.1) indicates that relatively long relaxation times prevail, i.e., a precursor of solid-like behavior. The time dependent increase of the storage modulus describes the transformation of the RR-P3HT solution from a fluid to a gel, i.e., "gelation process for RR-P3HT."

In addition to affecting the final gel strength, the concentration of RR-P3HT in solution was also found to affect the rate of gelation. The inset in FIG. 4 displays the first derivative of the storage modulus, dG'(t)/dt, normalized by Gmax', versus time. A characteristic gelation time, $t_c$, was defined as the time at which the maximum dG'(t)/dt value was observed. With increasing RR-P3HT concentration from 12.5 mg/mL to 50 mg/mL, $t_c$ decreased from 2000 seconds to 200 seconds, indicating a faster rate of gelation with increasing RR-P3HT concentration.

To probe the effect of temperature on the development of the rate of gelation and gel strength, time sweeps were carried out on fresh 25 mg/ml RR-P3HT solutions in o-DCB which were cooled to temperatures in the range of $0°$ C. to $-15°$ C. All of the targeted temperatures could be reached within 30 seconds after the environmental chamber was closed and temperature control was switched on. As displayed in FIG. 6, G' of a 25 mg/ml RR-P3HT solution in O-DCB cooled to $0°$ C. (data line 500) remained negligible for at least 1500 seconds, indicating that the solution remained as a viscous fluid during these 1500 seconds. For 25 mg/mL RR-P3HT solutions cooled to $-5°$ C. to $-15°$ C., on the other hand, a dramatic increase in G' from negligible values to a G' max=104 Pa was observed. The inset in FIG. 6 displays G' max and $t_c$ as a function of temperature. The G' max values of RR-P3HT, i.e., the gel strengths, were independent of temperature in the $-5°$ C. to $-15°$ C. range. However, the characteristic gelation time, $t_c$, decreased from 800 seconds to 250 seconds as the temperature decreased from $-5°$ C. to $-15°$ C., reflecting a significant increase of the rate of gelation with decreasing temperature.

Figure 7:
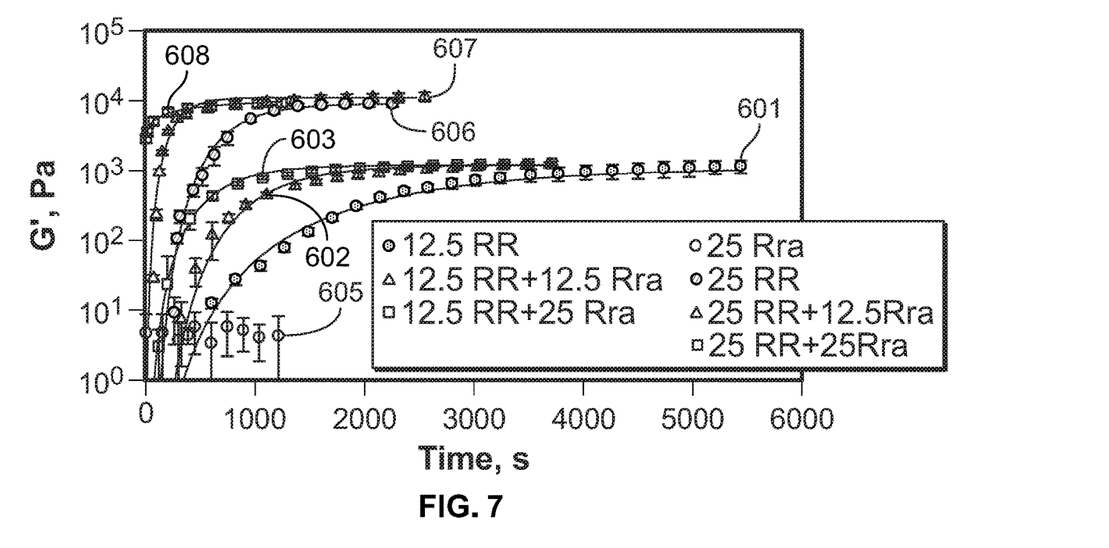
FIG. 7 shows a plot of storage modulus, G', versus time of blends of RR-P3HT and regiorandom poly(3-hexylthiophene) solutions in ortho-dichlorobenzene with concentrations: 12.5 or 25 mg/mL, cooled from room temperature to −5° C. in accordance with some embodiments of the invention.

To examine the role of crystallization on rapid P3HT gelation upon cooling, it was determined to examine the behavior of solutions comprising non-crystallizing regiorandom poly(3-hexylthiophene) (hereinafter also described as "Rra-P3HT") of similar molecular weight to that of the RR-P3HT used in these studies, 80 kDa and 70 kDa, respectively. Time sweeps of 25 mg/ml Rra-P3HT solutions in o-DCB revealed that Rra-P3HT does not form a gel upon cooling to −5° C. For example, FIG. 7 shows a plot of storage modulus versus time in seconds of blends of RR-P3HT and Rra-P3HT solutions in o-DCB with concentrations: 12.5 or 25 mg/mL, cooled from room temperature to −5° C. in accordance with some embodiments of the invention. For example, the data line for 12.5 mg/ml of RR-P3HT is shown as reference number 601, the data line for 12.5 mg/ml of RR-P3HT and 12.5 mg/ml Rra-P3HT is shown as reference number 602, and the data line for 12.5 mg/ml of RR-P3HT and 25 mg/ml Rra-P3HT is reference number 603. Further, the data line for 25 mg/ml of Rra-P3HT is shown as reference number 605, the data line for 25 mg/ml of RR-P3HT is shown as reference number 606, the data line for 25 mg/ml of RR-P3HT and 12.5 mg/ml Rra-P3HT is shown as reference number 607, and the data line for 25 mg/ml of RR-P3HT and 25 mg/ml Rra-P3HT is reference number 608.

As displayed, the storage modulus, G', of the solution comprising pure Rra-P3HT at a concentration of 25 mg/ml remained below 10 Pa upon cooling, thus indicating that intrachain crystallization, not chain entanglements, plays an integral role in both gelation and viscoelastic phase separation. In contrast to pure Rra-P3HT solutions, solutions comprising blends of RR-P3HT and Rra-P3HT with concentration ratios from 1:0.5 to 1:2 and total P3HT concentrations up to 50 mg/ml in o-DCB still exhibited gel formation upon cooling to −5° C.

Figure 8:
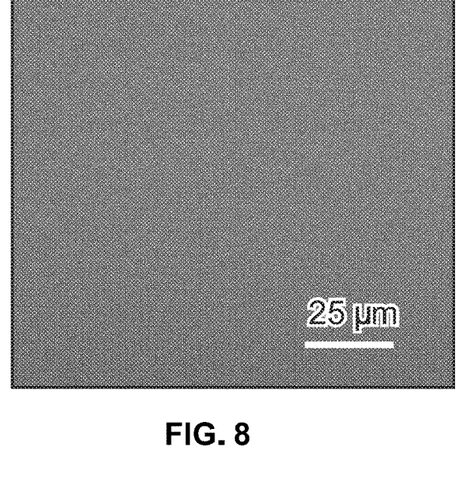
FIG. 8 shows a confocal laser scanning microscopy image of 25 mg/mL RR-P3HT in ortho-dichlorobenzene solution at 20° C.
Figure 9:
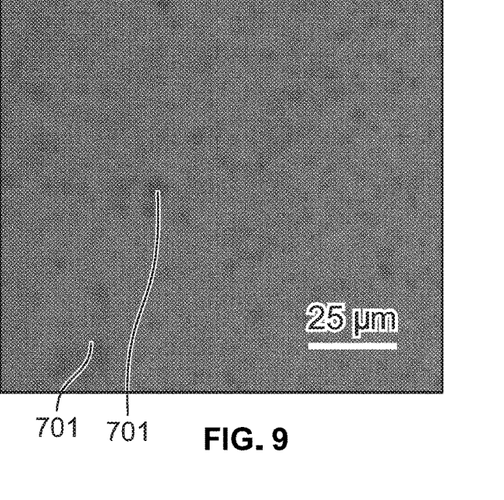
FIG. 9 shows a confocal laser scanning microscopy image of 25 mg/mL RR-P3HT in ortho-dichlorobenzene solution at −5° C.

Temperature-variable confocal fluorescence microscopy imaging can be used to reveal cooling-induced structural rearrangement to progress through viscoelastic phase separation, a phenomenon unique to polymer solutions and blends possessing dynamic asymmetry between the components. Further, to observe morphological development of P3HT solutions in real-time during cooling, photoluminescence (PL) was used to study the properties of P3HT. When excited at a wavelength of 488 nm, P3HT emits a photoluminescence signal between 500 nm and 700 nm, with a maximum PL signal around 570 nm. Temperature-variable confocal laser scanning microscopy (CLSM) was used to observe the gelation process and gain insights into the gelation mechanism of various compositions disclosed herein. The PL signal of RR-P3HT and Rra-P3HT solutions in o-DCB at room temperature and cooled to −5° C. under 488-nm laser excitation was mapped. Results are illustrated in FIG. 8, showing a confocal laser scanning microscopy image of 25 mg/mL RR-P3HT in o-DCB solution at 20° C., and FIG. 9, showing a confocal laser scanning microscopy image of 25 mg/mL RR-P3HT in o-DCB solution at −5° C. As displayed in FIG. 8, the fluorescence signal collected on a 25 mg/ml RR-P3HT solution in o-DCB at room temperature was spatially uniform, indicating that the polymer was well-dissolved in the solvent. Upon cooling to −5° C., dark "holes" shown as reference number 701 with diameters ranging from 1 to 5 μm in the fluorescence micrograph appeared (shown in FIG. 9). These solvent-rich holes 701, a hallmark of the initial stages of viscoelastic phase separation, appear due to dynamic asymmetry between the solvent molecules and polymer chains. Interestingly, the solvent-rich holes 701 persisted until the solutions were reheated to room temperature. In contrast, the natural progression of viscoelastic phase separation includes the development of solvent-rich holes 701 that grow and coalesce, eventually forming the majority phase. Rheological and fluorescence microscopy experiments indicate that the solution forms a stable gel upon cooling, with no change in gel properties or morphology after 60 min. For example, FIG. 7C shows an illustration of a polymer solution before and after cooling-induced viscoelastic phase separation in accordance with some embodiments of the invention. In this illustration, following rapid cooling, a solvent-rich hole 705 and interchain crystal 710 are depicted, and are not evident in the microstructure prior to cooling.

Figure 10:
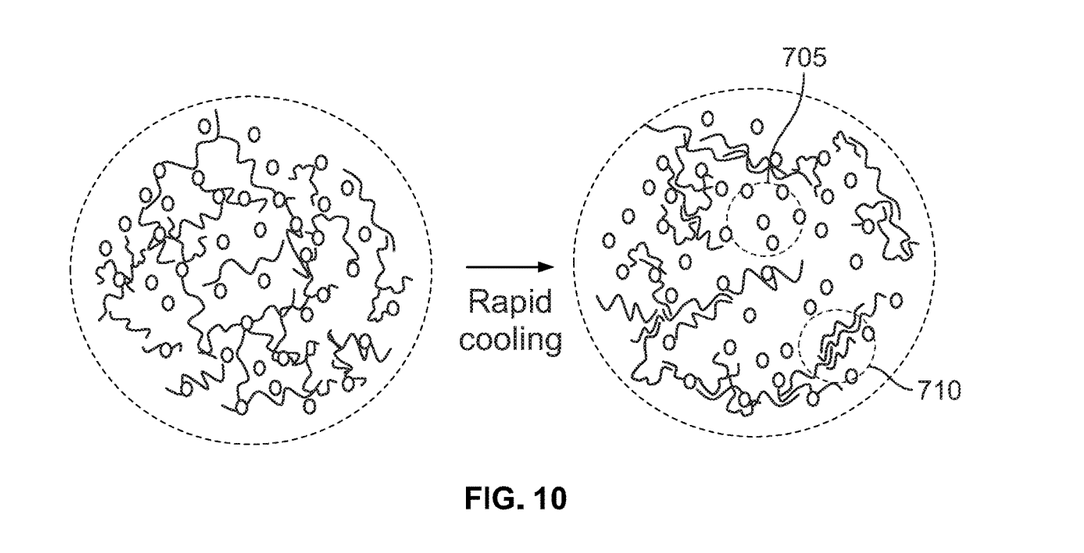
FIG. 10 shows an illustration of a transformation process of a polymer solution before and after cooling-induced viscoelastic phase separation in accordance with some embodiments of the invention.

The phase separation process arrested prematurely during the formation of micron-sized solvent-rich holes (shown as the solvent-rich holes 701 in FIG. 9, and represented as solvent-rich hole 705 in FIG. 10) within the RR-P3HT matrix can be attributed to intrachain crystallization that prevented the collapse of the polymer phase into isolated domains during phase inversion. Cryogen-based scanning electron microscopy images of partially de-solvated RR-P3HT gels further revealed the existence of an interfibrillar network exhibiting pores on the tens of nanometer length scale. These RR-P3HT networks, which formed both in the presence and absence of electron-accepting phenyl-C61-butyric acid methyl ester, can then be exploited for organic solar cells. In an embodiment, these RR-P3HT networks can be transferred to organic solar cell device platforms via doctor blading, a scalable method compatible with large-scale, continuous processing methods. Products of the novel gelation pathway described hereinabove exhibit interconnected networks for efficient photo-generated charge transport and exciton dissociation. Upon rapid cooling below the solubility limit, dilute solutions of semi-rigid regioregular poly(3-hexylthiophene) were found to form thermo-reversible gels, with the gel strength and rate of gelation dependent on the concentration and quenching temperature.

As revealed by a combination of rheological characterization and temperature-dependent advanced microscopy methods described above, a new gelation pathway can arrest viscoelastic phase separation in semiconducting RR-P3HT solutions at initial stages via interchain crystallization in order to form semi-crystalline gel networks with hierarchical porosity via gel formation at about −15° C. By affording continuous pathways for charge transport and large interfacial area with the electron-accepting PCBM phase, the presence of these P3HT networks in the active layers of organic solar cells is shown to enhance solar conversion efficiency. Significantly, these networks were formed in solution prior to active layer deposition in a highly reproducible manner. Crystallization-arrested viscoelastic phase separation thus presents a promising strategy to achieve optimal active layer morphologies by controlling the solution structure. Furthermore, this processing method is compatible with large-scale manufacturing methods to continuously process organic solar cell active layers from solution, which will benefit the advancement of this technology towards commercialization.

Other information concerning the subject matter of this application are presented in a publication by Jing He et al., titled "Crystallization-Arrested Viscoelastic Phase Separation in Semiconducting Polymer Gels," *ACS Applied Polymer Materials*, Vol. 1, No. 3, February 2019, pp. 500-508, the entire disclosure of which publication is incorporated herein by reference and made part of the present disclosure for all purposes.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. Various features and advantages of the invention are set forth in the following claims.

The invention claimed is:

1. A method comprising the steps of:
   i) at least partially mixing poly(3-hexylthiophene) with phenyl-C61 butyric acid methyl ester and at least one solvent to form a first solution which comprises said poly(3-hexylthiophene), said phenyl-C61 butyric acid methyl ester, and said at least one solvent, wherein said poly(3-hexylthiophene) includes at least some regio-regular poly(3-hexylthiophene);
   ii) cooling said first solution to a specified temperature to induce gelation of at least a portion of said first solution to form an at least partially gelled solution;
   iii) depositing at least a portion of said at least partially gelled solution onto at least a portion of a surface to form an at least partially coated surface; and
   iv) at least partially drying said at least partially coated surface by removing at least a portion of said at least one solvent from at least a portion of said at least partially coated surface.

2. The method of claim 1, wherein said specified temperature is between −5° C. and −15° C.

3. The method of claim 1, wherein at least one of step i) and step ii) is performed in an extruder.

4. The method of claim 3, wherein said extruder is a twin-screw extruder.

5. The method of claim 1, wherein step iii) is performed using one or more of a slit-die, a doctor-blade, or a blade-coater.

6. The method of claim 1, wherein said surface of said at least a portion of a surface comprises an outer surface of a solar cell precursor material.

7. The method of claim 6, wherein said solar cell precursor material comprises indium tin oxide.

8. The method of claim 1, wherein said at least one solvent includes ortho-dichlorobenzene.

9. The method of claim 1, further comprising a step of annealing said at least partially coated surface by passing said at least partially coated surface through an oven.

10. The method of claim 9, wherein said oven is an environmentally-controlled oven configured to control temperature and humidity.

11. The method of claim 1, wherein at least two or more of the steps i) to at least step iii) occur simultaneously.

12. The method of claim 1, wherein said at least partially gelled solution includes a semi-crystalline gel network.

13. The method of claim 1, wherein said at least partially gelled solution is a thermo-reversible gel.

14. The method of claim 1, wherein said poly(3-hexylthiophene) includes at least some regiorandom poly(3-hexylthiophene).

15. An extrusion process comprising the steps of:
    i) providing an extruder including at least one mixing zone;
    ii) feeding poly(3-hexylthiophene), phenyl-C61 butyric acid methyl ester, and at least one solvent into said at least one mixing zone of said extruder, wherein said poly(3-hexylthiophene) includes at least some regio-regular poly(3-hexylthiophene);
    iii) operating said extruder to form a first solution which comprises said poly(3-hexylthiophene), said phenyl-C61 butyric acid methyl ester, and said at least one solvent;
    iv) cooling said first solution to a specified temperature to induce gelation of at least a portion of said first solution to form an at least partially gelled solution;
    v) depositing at least a portion of said at least partially gelled solution onto at least a portion of a surface to form an at least partially coated surface; and
    vi) at least partially drying said at least partially coated surface by removing at least a portion of said at least one solvent from at least a portion of said at least partially coated surface.

16. The extrusion process of claim 15, wherein step iv) occurs in said extruder.

17. The extrusion process of claim 15, wherein step v) occurs by operating said extruder to force at least a portion of said solution out of said extruder and through a die.

18. The extrusion process of claim 17, wherein said die includes one or more of a slit-die, a doctor-blade, or a blade-coater.

19. The extrusion process of claim 15, wherein said extruder comprises a twin-screw extruder.

20. The extrusion process of claim 15, wherein said poly(3-hexylthiophene) includes at least some regiorandom poly(3-hexylthiophene).

* * * * *